United States Patent [19]

Nishizawa et al.

[11] Patent Number: 5,185,185
[45] Date of Patent: Feb. 9, 1993

[54] PROCESS OF PRETREATMENT OF METAL-PLATING RESIN MOLDED ARTICLES

[75] Inventors: Chiharu Nishizawa, Matsudo; Yoshiharu Kondo; Masaru Ohto, both of Tokyo, all of Japan

[73] Assignee: Mitsubishi Gas Chemical Company, Inc., Tokyo, Japan

[21] Appl. No.: 632,484

[22] Filed: Dec. 24, 1990

[30] Foreign Application Priority Data

Dec. 26, 1989 [JP] Japan .................................. 1-335171

[51] Int. Cl.$^5$ ............................................. C23C 26/00
[52] U.S. Cl. ................................... 427/304; 427/305; 427/306; 427/307; 205/210; 205/211
[58] Field of Search ............... 427/306, 305, 304, 307; 205/210, 211

[56] References Cited

U.S. PATENT DOCUMENTS

| | | | |
|---|---|---|---|
| 4,042,729 | 8/1977 | Polichette | 427/305 |
| 4,486,463 | 12/1984 | Rubner | 427/306 |
| 4,532,015 | 7/1985 | Boultinghouse | 427/306 |
| 4,594,311 | 6/1986 | Frisch | 427/98 |
| 4,795,671 | 1/1989 | Shiiki | 264/104 |
| 4,812,275 | 3/1989 | Yumoto | 427/306 |

FOREIGN PATENT DOCUMENTS 233494 8/1987 European Pat. Off. .
385165 9/1990 European Pat. Off. .

OTHER PUBLICATIONS

Database WPIL, No. 89-360 045, Derwent Publications Ltd., London, GB *Abstract*.

*Primary Examiner*—Shrive Beck
*Assistant Examiner*—Vi Duong Dang
*Attorney, Agent, or Firm*—Wenderoth, Lind & Ponack

[57] ABSTRACT

A process of pretreatment of metal-plating a resin molded article molded from a resin composition containing as main components a polyphenylene sulfide (PPS) resin, a glass-reinforcing agent and optionally one or more other thermoplastic resins comprises
(1) treating the resin molded article by immersion in an oxidative acid solution (A treatment),
(2) treatng the resulting resin molded article by immersion in an organic polar solvent-containing liquid (B treatment), and then
(3) treating the resulting resin molded article by immersion in a solvent which can dissolve one or both of the glass reinforcing agent and one or more of the other thermoplastic resins (C treatment). The PPS resin contains a paraphenylene sulfide unit

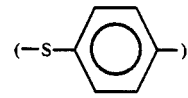

in an amount of at least 70 mole % of all recurring units. Total amount of PPS resin and the glass-reinforcing agent is at least 60% by weight of the resin composition, and the ratio of the PPS resin to the glass-reinforcing agent is in the range of 2:8 to 9:1 by weight. The other thermoplastic resin, preferably polyester, polyarylate, polyamide, polyetherimide, polyethersulfone and polycarbonate is contained in an amount of 5 to 20% by weight. Typically the acid solution used in A treatment is a mixed liquid of hydrogen peroxide and sulfuric acid, and the organic polar solvent-containing liquid used in C treatment contains N-methylpyrrolidone or dimethylacetamide in an amount of at least 5% by weight. C treatment includes sulfuric acid treatment (C-1 treatment) and/or aqueous alkali solution treatment (C-2 treatment).

7 Claims, No Drawings

PROCESS OF PRETREATMENT OF METAL-PLATING RESIN MOLDED ARTICLES

BACKGROUND OF THE INVENTION

1. Field of the Invention

The present invention relates to a process pretreatment of metal-plating a resin molded article formed from a resin composition containing as main components a polyphenylene sulfide and a glass-reinforcing agent (filler). More detailedly, the invention relates to a process which comprises pretreating the above resin molded article and then metal-plating the resultant resin molded article to obtain a resin molded article having a high peel strength of the metal plated layer as well as an excellent smoothness of the surface.

2. Prior Art

Polyphenylene sulfide (hereinafter sometimes abbreviated as "PPS") is known as a resin excellent in heat resistance, solvent resistance, electric characteristics, mechanical strength, dimensional stability, flame retardancy, etc., and has recently received attention. Particularly, this PPS resin can further be improved in the above performances by conjugation with a fibrous reinforcing agent such as glass fiber and carbon fiber or with an inorganic filler such as talc, clay and silica, and the resultant improved resins are widely used as electric parts, electronic parts, mechanical structural parts, etc. On the other hand, based on its excellent solder heat resistance, dielectric characteristic and the like, use development of PPS resin as a material for printed circuit boards, three dimensional molded printed circuit boards has also been progressed. It is considered that metal plating is indispensable for PPS resin molded articles to be utilized for these uses. However, since PPS resin is excellent in chemical resistance, the resin is extremely hard to be chemically etched and when metal-plating is made, it is difficult to obtain a sufficient peel strength of the metal. Thus, there has been developed and proposed treating liquids for chemically etching, before metal plating, molded articles of PPS resins or reinforced PPS resin compositions. For example, a process is known which comprises etching a molded article of a PPS resin, particularly a glass fiber-reinforced PPS resin composition, with nitric acid alone or a mixed liquid of nitric acid and hydrofluoric acid (Japanese Laid-Open Patent Publication No. 54290/1984). Because this known process includes a severe treatment for obtaining a sufficient peel strength of the metal plated layer the glass reinforcing agent contained in the PPS resin is completely dissolved and removed. As a result, unevenness of the plated surface becomes extremely large and appearance thereof also becomes bad. When a plated product is used in preparation of a printed circuit board by resist pattern formation, electroplating or the like or a three dimensional molded printed circuit board, it has become a large obstacle and practical problem that unevenness of the plated surface is thus large and surface smoothness is insufficient.

SUMMARY OF THE INVENTION

On of the coinventors together with other coinventors have studied and proposed a process of pretreatment of metal-plating a molded resin article, which comprises treating a molded resin article by immersion in a mixed liquid of nitric acid and hydrofluoric acid (or its salt), and then treating the resulting resin article by immersion in an organic polar solvent such as N-methylpyrrolidone (of. U.S. patent application Ser. No. 07/477,763 and European Patent Application No. 90102688.0). The above proposed process is an excellent process as pretreatment of metal-plating.

However, it has recently been required that the use of materials for electronic parts must be expanded to include metal plated molded articles which have more excellent appearance and permits fine resist pattern formation. For this purpose, it is necessary to form a metal plated layer having a more smooth surface and a greater peel strength on the surfaces of the molded articles.

Accordingly, the present inventors have studied intensively with view to developing a process of pretreatment of metal-plating for obtaining metal plated product which has an excellent surface smoothness and a strong peel strength of the metal plated layer. As a result, it has been found that the above objects can be attained by immersing a PPS molded article in (1) an oxidative acid, (2) an organic polar solvent, and (3) a solvent which dissolves one or both of a glass reinforcing agent and a thermoplastic resin, in this order.

The present invention has been accomplished based on such findings, and relates to a process of pretreatment of metal-plating a resin molded article molded from a resin composition containing as main components a polyphenylene sulfide resin, a glass-reinforcing agent and optionally one or more other thermoplastic resins, which comprises, (1) treating the resin molded article by immersion in an oxidative acid solution (A treatment), (2) treating the resulting resin molded article by immersion in an organic polar solvent-containing liquid (B treatment), and then (3) treating the resulting resin molded article by immersion in a solvent which can dissolve one or both of the glass reinforcing agent and the one or more other thermoplastic resins (C treatment).

According to the process of the present invention, the PPS resin, glass reinforcing agent and optionally contained thermoplastic resins which are present on the surface of the resin molded article are dissolved or removed under appropriate conditions to form numerous minute depressions on the surface of the resin molded article, and when the resin molded article is metal plated, the numerous depressions are considered to contribute to increase in the peel strength of the metal plated layer. In addition, the process of the present invention does not roughen the surface of the molded article excessively because it does not use mixed liquids composed of nitric acid and hydrofluoric acid, resulting in that when metal plating is performed, products having extremely smooth surfaces can be obtained.

DETAILED DESCRIPTION OF THE INVENTION

Hereafter, the present invention will be explained in greater detail.

[I] PPS Resin

Any PPS resin usually referred to as PPS resin can be used in the present invention, but generally suitable is a PPS resin containing the paraphenylene sulfide unit

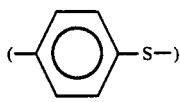

in an amount of at least 70 mole % preferably at least 90 mole % of all the recurring units. If the paraphenylene sulfide unit in the PPS resin is less than 70 mole %, it is difficult to obtain a composition having excellent properties peculiar to PPS.

Various known processes can be employed as processes of polymerization for preparation of PPS resins used in the invention, but preferred is a process which comprises reacting sodium sulfide with p-dichlorobenzene in an amide solvent such as N-methylpyrrolidone and dimethylacetamide or a sulfone solvent such as sulfolane. It is preferred in the process to add a carboxylate salt of alkali metal such as sodium acetate or lithium acetate in order to adjust the polymerization degree. The PPS resin can contain as copolymerization component(s)

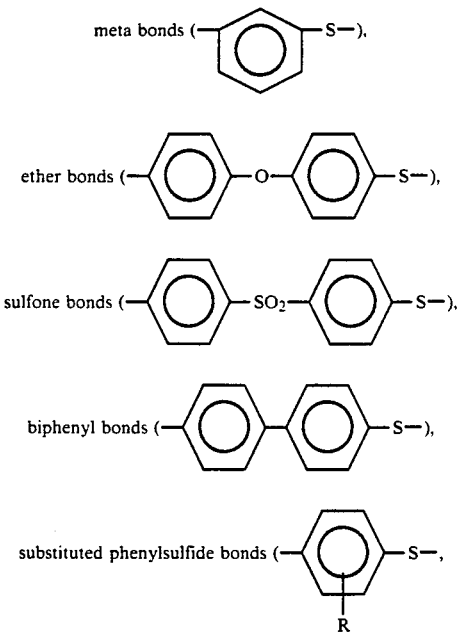

wherein R represents an alkyl, nitro, phenyl or alkoxy group) and the like, in an amount less than 30 mole % and in the range which does not affect adversely on crystallinity of the resultant polymer, but it is preferred that amount of these copolymerization components is less than 10 mole %.

It is desirable that the PPS resin of the invention has a melt viscosity at 300° C. of about 100 to about 40,000 poise, preferably about 100 to about 20,000 poise.

The resin composition of the invention is composed mainly of the above PPS resin and a glass-reinforcing agent. As such glass-reinforcing agents, glass fiber is typical, but in addition glass beads, glass powder, quarts fiber, quarts beads, quarts powder and the like can be mentioned. Most preferred among them is glass fiber.

It is desirable in the resin composition of the invention that total amount of the above PPS resin and glass-reinforcing agent is at least 60 %, preferably at least 70 % by weight, of the whole resin composition, and the ratio of the PPS resin to the glass-reinforcing agent is in the range of 2:8 to 9:1, preferably 3:7 to 7:3.

Thus, the resin composition of the invention can contain other thermoplastic resin component(s) than the PPS resin and glass-reinforcing agent in an amount less than 40 %, preferably less than 30 % by weight.

As explained below, the resin composition containing the other thermoplastic resin(s) than PPS resin in an amount of 5 to 20 % by weight based on the weight of the resin composition gives more favorable results.

There can be mentioned as specific examples of these other thermoplastic resin components resins polyester (for example, polyethylene terephthalate, polybutylene terephthalate, etc.), polyarylate (for example, polyarylates derived from terephthalic acid, isophthalic acid, bisphenol A, etc.), polyamide (for example, nylon6, nylon-6,6, etc.), polyetherimide (for example, "UL-TEM", registered trademark for a product by GE Plastics Co., Ltd.), polyethersulfone (for example, polyethers such as dichlorodiphenylsulfone, etc.), and polycarbonate (for example, bisphenol A type polycarbonate). These can be used singly or two or more of them can be used in combination. Among them, preferred are polyesters such as polyethylene terephthalate and polybutylene terephthalate.

It is preferred to add these other thermoplastic resins to the system while the system is mixed so that they can be finely dispersed in the PPS resin matrix. Thus when these other resins are added to the PPS resin matrix in the above-described manner, these other resin components than the PPS resin which disperse on the surface of the resin molded article like islands are suitably eluted and removed by treatment of the invention, and numerous minute pores are formed on the surface, and due to such minute pores, adhesion of plating is still further enhanced compared to the case of a molded article of the PPS resin alone.

Furthermore, the resin composition which can be used in the process of the present invention may contain various known additives which are used usually in the art. Examples thereof include an inorganic filler such as titanium oxide, calcium carbonate, barium sulfate, potassium titanate, asbestos, carbon fiber, calcium silicate, mica or talc, and in addition a flame retardant, an antioxidant, an ultraviolet radiation absorber, and a pigment.

[II] Treatment by Immersion According to the Invention

In the present invention, the above-described resin composition is molded according to a process known per se, and the resultant resin molded article is subjected, before metal plating, to the afore-described A treatment, B treatment and C. treatment in this order.

Each of these treatments is described in detail below.

(1) A Treatment

The resin molded article is at first treated by immersion in an oxidative acid solution. As the oxidative acid solution, there can be used acids which can roughen the surface of the resin molded article by oxidation or decomposition. Generally, inorganic acids are used. As preferred examples of such acid, there can be mentioned (i) nitric acid commercially available and having a concentration of 30 to 65 % by weight, and (ii) mixed liquids of hydrogen peroxide and sulfuric acid. In the case of the mixed liquids of hydrogen peroxide and sulfuric acid, the both components may be mixed in any desired ratios. For example, when sulfuric acid (98 % by weight) and aqueous hydrogen peroxide solution (30 % by weight) are used, the both components are mixed in a mixing ratio, sulfuric acid/hydrogen peroxide ratio, in the range of preferably 90/10 to 30/70 by weight. However, the concentration and mixing ratio of sulfuric acid and hydrogen peroxide are not limited to the above. It is desirable to carry out immersion of the resin molded article in the oxidative acid solution in this A treatment at temperatures in the range of 10° to 80° C., preferably 40° to 60° C. for 1 to 60 minutes, preferably 2 to 10 minutes. Then the resin molded article is washed with water. The washing with water is continued until the acid is removed sufficiently.

(2) B Treatment

The resulting resin molded article after the above A treatment is then treated by immersion in an organic polar solvent-containing liquid. Preferred examples of this organic polar solvent include N-methylpyrrolidone and dimethylacetamide. N-Methylpyrrolidone is particularly preferred.

The organic polar solvent-containing liquid in this B treatment can either be the above organic polar solvent itself or a mixed liquid of this polar solvent and an other medium. In the case of the mixed liquid, it is suitable that the organic polar solvent is contained in a concentration of at least 5 %, more preferably at least 20 % by weight. Specific examples of the mixed liquid containing organic polar solvent(s) include N-methylpyrrolidone/dimethylacetamide, N-methylpyrrolidone/dimethylformamide, N-methylpyrrolidone/ethanol, N-methylpyrrolidone/water, dimethylacetamide/dimethylformamide, etc.

This B treatment can be carried out by immersing the resin molded article in the organic polar solvent-containing liquid at temperatures in the range of room temperature to 60° C., preferably room temperature to 40° C., for 1 to 60 minutes, preferably 1 to 20 minutes. A still further preferred result can be obtained by carrying out the treatment by immersion together with ultrasonic treatment.

After B treatment was thus conducted, the resulting resin molded article is washed with water and sent to the next step. Effect of this water washing is further enhanced by the ultrasonic treatment. When whitened deteriorated resin layers are present on the surface of the resin molded article after completion of the above B treatment, B treatment and water washing are carried out again.

(3) C. Treatment

Following the above B treatment, the resin molded article is immersed in a solvent which can dissolve one or both of the glass reinforcing agent and the other thermoplastic resin(s) other than PPS.

Preferred specific examples of such solvent include sulfuric acid and aqueous alkali solution. While these can be used singly, treatments using them singly can be employed in combination. An enhanced effect can be obtained by carrying out treatment by immersion in sulfuric acid alone (C-1 treatment) and treatment by immersion in an aqueous alkali solution alone (C-2 treatment) in combination. When the C-1 treatment and C-2 treatment are carried out in combination, it is desirable to carry out them in this order.

In the above C-1 treatment, sulfuric acid may be one which is commercially available and has a concentration of 50 to 98 % by weight, preferably 85 to 98 % by weight. Immersion in this C-1 treatment is carried out at temperatures of 10° to 80° C., preferably 20° to 50° C., for 1 to 10 minutes, preferably 2 to 5 minutes. Immediately after the immersion in sulfuric acid, water washing is carried out. In this case, ultrasonic treatment is effective.

In the above C-2 treatment, aqueous solutions of potassium hydroxide and of sodium hydroxide may be used as the aqueous alkali solution. Mixed liquids of them may also be used. The concentration of the aqueous alkali solution is 10 % by weight to saturation, preferably 2 to 50 % by weight. Conditions of the immersion treatment are such that the temperature is 20 to 100° C., preferably 50° to 80° C., and the immersion time is a time enough for metal plated products to have a sufficient peel strength, usually on the order of 3 to 20 minutes but is not limited thereto. After treatment with the aqueous alkali solution, the resulting resin molded article is washed with water at room temperature until the aqueous alkali solution is fully removed. When the resin molded article is subjected to C-1 treatment (sulfuric acid) or C-2 treatment (aqueous alkali solution) alone and then metal plating, the metal plated layer can have a sufficient peel strength if a longer immersion time is given.

[III] Metal Plating Treatment

The resin molded article is subjected to metal plating treatment in a manner known per se after the afore-mentioned A, treatment, B treatment and C. treatment. The above pretreatment of the present invention is extremely effective regardless of the process of metal plating and kind of metal used in the metal plating.

Next, explanation will be made on procedures of metal plating taking copper plating as an example. Namely, the resin molded article after the pretreatment of the present invention is immersed in an aqueous hydrochloric acid solution as predipping. Then the resulting resin molded article is immersed in an aqueous solution in which a catalyst is dispersed to attach the catalyst on the surface of the resin molded article. After washing with water, the thus-obtained molded article is further immersed in a solution which activates the catalyst, followed by water washing. The resulting molded article is dipped in an electroless plating bath to deposit copper on the surface of the molded article. When the thickness of the deposited copper layer has reached about 1 μm, the molded article is taken out and washed with water.

The thus-obtained molded article is then dipped in an electrolytic copper plating bath and copper plating is carried out. When the thickness of the copper plated layer has reached a predetermined thickness, the molded article is taken out and washed with water. As described above, a plated layer having an excellent surface smoothness can be obtained by subjecting the resin molded article to the pretreatment of the present invention before metal plating.

EXAMPLES

The present invention will be explained in greater detail by examples and comparative examples.

In the following examples and comparative examples surface smoothness of the plated resin articles was evaluated by measurement of center line average roughness (Ra).

Measuring methods of this center line average roughness (Ra) are detailedly described in ANSI B 46.1-1979 and in ISO R 468-1966 in USA, and in JIS B 0601-1982 in Japan.

In the invention, surface roughness (Ra) of resin moldings was measured using "surface roughness tester surfcom 554A type" produced by TOKYO SEIMITSU CO., LTD.

EXAMPLE 1

PPS resin pellets (2.7 kg) containing 40 % of glass fiber (produced by Phillips Petroleum Company, RYTON R-4) and 0.3 kg of polyethylene terephthalate (produced by Nippon Unipet Co., Ltd., UNIPET A, hereafter abbreviated as "PET") were melt-kneaded using a twin-screw extruder to obtain resin pellets. The pellets were molded into plates (length 100 mm, width 25 mm, thickness 1.6 mm) as test pieces using an injection molding machine.

The above test pieces were annealed at 120° C. for 2 hours, subjected to degreasing treatment and then subjected to the following pretreatment steps (steps 1 to 4).

(1) Etching (A treatment)

The above test pieces were immersed in 61 % nitric acid at 45° C. for 5 minutes, and then water washed with deionized water for 1 minute.

(2) Solvent Treatment (B Treatment)

The test pieces were immersed in N-methyl-2pyrrolidone at room temperature for 4 minutes and subjected to ultrasonic treatment for 1 minute in the same liquid. Then, the test pieces were washed with deionized water for about 3 minutes.

(3) Sulfuric Acid Treatment (C-1 Treatment)

The test pieces were immersed in sulfuric acid (95 % by weight) at room temperature for 3 minutes, and then water washed with deionized water for 3 minutes.

(4) Aqueous Alkali Solution Treatment (C-2 Treatment)

The test pieces were immersed in an aqueous potassium hydroxide solution in a concentration of 40 % by weight at 75° C. for 10 minutes. Then, they were water washed with deionized water for 3 minutes.

(5) Predipping

The test pieces after the pretreatment steps were immersed in 10 % aqueous hydrochloric acid solution for 2 minutes.

(6) Catalyzing

After the predipping the test pieces were immersed in an aqueous solution containing 200 ml of 35 % hydrochloric acid and 20 ml of a catalyst (PB-316 produced by EBARA-UDYLITE) in 1 liter of water for 5 minutes, and then water washed with deionized water for 1 minute.

(7) Accelerating

The resulting test pieces were immersed for 2 minutes in an aqueous solution containing 150 ml of PB-444, an accelerator produced by EBARA-UDYLITE in 1 liter of water, and then water washed with deionized water for 1 minute.

(8) Electroless Plating

The resulting test pieces were immersed for 1 hour in a solution of each 100 ml of electroless copper plating liquids PB-502A and PB-502B produced by EBARA-UDYLITE in 1 liter of water to be electrolessly copper-plated to a thickness of about 1 μm, and then water washed with deionized water for 1 minute. The surface roughness (Ra) of the test pieces was measured using "Surface Roughness Tester SURFCOM 554A type" produced by TOKYO SEIMITSU CO., LTD.

(9) Electroplating

The electrolessly copper-plated test pieces were immersed in 10 % sulfuric acid for 30 seconds, immersed in an electric copper plating bath containing in 1 liter thereof 75 g of $CuSO_4.5H_2O$, 180 g of sulfuric acid, 0.125 ml of 35 % hydrochloric acid and 5 ml of Cu-Brite TH, a brightener produced by EBARA-UDYLITE, copper electroplated at a current density of 3 $A/dm^2$ for about 1 hour to a thickness of copper of about 35 μm, and then water washed with deionized water for 1 minute.

(10) Drying

The test pieces after the copper electroplating were dried at 120° C. for 24 hours.

The test pieces after the copper electroplating of the drying step were measured for peel strength according to JIS 6481 (measured by TSM-20 type produced by TOSOKU SEIMITSU KOGYO CO.). Further, an appearance test by visual observation was also carried out. These results were indicated in Table 1.

EXAMPLE 2

Procedures of Example 1 were repeated except that the pellets were changed for pellets obtained by melt-kneading 2.4 kg of the same PPS resin pellets as used in Example 1 and 0.6 kg of the same PET as used in Example 1. The resulting copper electroplated test pieces were subjected to measurement of peel strength and surface roughness and appearance test by visual observation in the same manner as in Example 1. These results were indicated in Table 1.

EXAMPLE 3

Procedures of Example 1 were repeated except that 1.62 k9 of PPS resin pellets T-4P (produced by TOHPREN Company), 1.08 k9 of 9lass fiber (CS03MA404, produced by Asahi Fiber Glass Co., Ltd.) and 0.3 kg of PET were uniformed mixed, and then melt-kneaded at 300° to 320° C. using a twin-screw extruder to obtain pellets. Procedures of Example 1 were repeated using the resulting pellets to form test pieces. The test pieces were subjected to measurement of peel strength and surface roughness and appearance test by visual observation in the same manner as in Example 1. These results were indicated in Table 1.

COMPARATIVE EXAMPLE 1

The same test pieces as those used in Example 1 were immersed in an etching solution of 100 g of acidic ammonium fluoride in 600 ml of 61 % nitric acid at 50° C. for 10 minutes and then water washed with deionized water for 1 minute. Then the treatments (5) to (10) in Example 1 were repeated. The resulting test pieces were subjected to measurement of surface roughness and peel strength and appearance test by visual observation in the same manner as in Example 1. These results were indicated in Table 1.

COMPARATIVE EXAMPLE 2

The same test pieces as those used in Example 1 were immersed in an etching solution of 100 g of acidic ammonium fluoride in 600 ml of 61 % nitric acid at 50° C. for 10 minutes and then water washed with deionized water for 1 minute. After the solvent treatment (2) in Example 1 was conducted, the test pieces were immersed in 50 % hydrofluoric acid at 40° C. for 5 minutes, followed by subjecting to the plating procedures (5) to (10) in Example 1. The resulting test pieces were subjected to measurement of surface roughness and peel strength and appearance test by visual observation in the same manner as in Example 1. These results were indicated in Table 1.

COMPARATIVE EXAMPLE 3

Procedures of Example 1 were repeated except that the sulfuric treatment (3) and the aqueous alkali treatment (4) therein were omitted. The resulting test pieces were subjected to measurement of surface roughness and peel strength and appearance test by visual observation in the same manner as in Example 1. These results were indicated in Table 1.

EXAMPLE 5

RYTON R-4 (2.7 kg) used in Example 1 and 0.3 kg of polyarylate (U POLYMER U-100, produced by Unitika Co., Ltd.) were melt-kneaded using a twin-screw extruder to obtain resin pellets. The pellets were molded into plates (length 100 mm, width 25 mm, thickness 1.6 mm) as test pieces using an injection molding machine.

The above test pieces were annealed at 120° C. for 2 hours, subjected to degreasing treatment and then subjected to the same procedures as in Example 1. The resulting test pieces were subjected to measurement of surface roughness and peel strength and appearance test by visual observation in the same manner as in Example 1. These results were indicated in Table 2.

EXAMPLE 6

RYTON R-4 (2.7 kg) used in Example 1 and 0.3 kg of polyetheramide (ULTEM, 1,000, produced by GE Plastics Co., Ltd.) were melt-kneaded using a twin-screw extruder to obtain resin pellets. The pellets were molded into plates (length 100 mm, width 25 mm, thickness 1.6 mm) as test pieces using an injection molding machine.

The above test pieces were annealed at 120° C. for 2

TABLE 1

|  | Composition(*2) (Blend Ratio) | Treatment(*3) | Surface Roughness (Ra) (μm) | Peel Strength (kg/cm) | Appearance(*1) |
|---|---|---|---|---|---|
| Example 1 | R-4/PET 90/10 | NA/NMP/SA/PH | 1.1 | 1.4 | ⊚ |
| Example 2 | R-4/PET 80/20 | NA/NMP/SA/PH | 1.5 | 1.3 | ⊚ |
| Example 3 | T-4P/GF/PET 54/36/10 | NA/NMP/SA/PH | 1.0 | 1.3 | ⊚ |
| Comparative Example 1 | R-4 100 | NA-AF | 9.7 | 1.4 | X |
| Comparative Example 2 | R-4 100 | NA-AF/NMP/HA | 3.0 | 1.5 | ○ |
| Comparative Example 3 | R-4/PET 90/10 | NA/NMP | 0.8 | 0.3 | ⊚ |

Notes for Table 1:
(*1)⊚: One having an extremely smooth surface and being lustrous
○: One having a smooth surface and being lustrous
X: One having a rough surface and being cloudy
(*2)R-4: Phillips PPS containing 40% of glass fiber (GF)
PET: Polyethylene terephthalate
T-4P: THOPREN PPS
(*3) NMP: N-Methyl-2-pyrrolidone
NA: Nitric acid
SA: Sulfuric acid
PH: Potassium hydroxide
AF: Ammonium fluoride
HA: Hydrofluoric acid

EXAMPLE 4

RYTON R-4 (2.7 kg) used in Example 1 and 0.3 kg of polybutylene terephthalate (PBT1401, produced Toray Corporation) were melt-kneaded using a twin-screw extruder to obtain resin pellets. The pellets were molded into plates (length 100 mm, width 25 mm, thickness 1.6 mm) as test pieces using an injection molding machine.

The above test pieces were annealed at 120° C. for 2 hours, subjected to degreasing treatment and then subjected to the same procedures as in Example 1. The resulting test pieces were subjected to measurement of surface roughness and peel strength and appearance test by visual observation in the same manner as in Example 1. These results were indicated in Table 2.

hours, subjected to degreasing treatment and then subjected to the same procedures as in Example 1. The resulting test pieces were subjected to measurement of surface roughness and peel strength and appearance test by visual observation in the same manner as in Example 1. These results were indicated in Table 2.

EXAMPLE 7

RYTON R-4 (2.7 kg) used in Example 1 and 0.3 kg of polyamide (NYLON-6 1101, produced by Toray Corporation) were melt-kneaded using a twin-screw extruder to obtain resin pellets. The pellets were molded into plates (length 100 mm, width 25 mm, thickness 1.6 mm) as test pieces using an injection molding machine.

The above test pieces were annealed at 120° C. for 2 hours, subjected to degreasing treatment and then subjected to the same procedures as in Example 1. The resulting test pieces were subjected to measurement of surface roughness and peel strength and appearance test by visual observation in the same manner as in Example 1. These results were indicated in Table 2.

The resulting test pieces were subjected to measurement of surface roughness and peel strength and appearance test by visual observation in the same manner as in Example 1. These results were indicated in Table 2.

TABLE 2

| | Composition(*2) (Blend Ratio) | Treatment(*3) | Surface Roughness (Ra) (μm) | Peel Strength (kg/cm) | Appearance(*1) |
|---|---|---|---|---|---|
| Example 4 | R-4/PBT 90/10 | NA/NMP/SA/PH | 0.9 | 1.2 | ⊚ |
| Example 5 | R-4/PAR 90/10 | NA/NMP/SA/PH | 1.1 | 1.3 | ⊚ |
| Example 6 | R-4/PEI 90/10 | NA/NMP/SA/PH | 1.2 | 1.4 | ⊚ |
| Example 7 | R-4/PA 90/10 | NA/NMP/SA/PH | 1.2 | 1.3 | ⊚ |
| Example 8 | R-4 100 | NA/NMP/SA/PH | 0.9 | 1.2 | ⊚ |
| Example 9 | R-4/PET 90/10 | NA/DMA/SA/PH | 1.0 | 1.4 | ⊚ |
| Example 10 | R-4/PET 90/10 | NA/NMP/PH | 0.8 | 1.2 | ⊚ |
| Example 11 | R-4/PET 90/10 | HP-SA/NMP/ SA/PH | 1.4 | 1.2 | ⊚ |

Notes for Table 2:
(*1)⊚: One having an extremely smooth surface and being lustrous
○: One having a smooth surface and being lustrous
X: One having a rough surface and being cloudy
(*2)R-4: Phillips PPS containing 40% of glass fiber (GF)
PBT: Polybutylene terephthalate
PAR: Polyarylate
PEI: Polyetherimide
PA: Polyetheramide
PET: Polyethylene terephthalate
(*3) NMP: N-Methyl-2-pyrrolidone
DMA: N,N-Dimethylacetamide
NA: Nitric acid
SA: Sulfuric acid
PH: Potassium hydroxide

EXAMPLE 8

RYTON R-4 (2.7 kg) used in Example 1 was molded into plates (length 100 mm, width 25 mm, thickness 1.6 mm) as test pieces using an injection molding machine.

The above test pieces were annealed at 120° C. for 2 hours, and subjected to degreasing treatment. Thereafter, procedures of Example 1 were repeated except that the aqueous alkali treatment (4) in Example 1 was conducted at 75° C. for 24 hours. The resulting test pieces were subjected to measurement of surface roughness and peel strength and appearance test by visual observation in the same manner as in Example 1. These results were indicated in Table 2.

EXAMPLE 9

Procedures of Example 1 were repeated except that the solvent treatment (2) in Example 1 was conducted using N,N-dimethylacetamide in place of N-methylpyrrolidone. The resulting test pieces were subjected to measurement of surface roughness and peel strength and appearance test by visual observation in the same manner as in Example 1. These results were indicated in Table 2.

EXAMPLE 10

Procedures of Example 1 were repeated except that the sulfuric acid treatment (3) in Example 1 was omitted and that the time of the aqueous alkali treatment (4) by immersion in aqueous potassium hydroxide solution in Example 1 was changed for 2 hours. The resulting test pieces were subjected to measurement of surface roughness and peel strength and appearance test by visual observation in the same manner as in Example 1. These results were indicated in Table 2.

EXAMPLE 11

Procedures of Example 1 were repeated except that the etching treatment (1) in Example 1 was conducted using a mixed liquid of sulfuric acid (98 % by weight) and aqueous hydrogen peroxide solution (30 % by weight) in a mixing ratio of 3:1 in place of nitric acid.

As is apparent from Examples 1 to 11 and Comparative Examples 1 to 3, when the pretreatment process of the present invention is used, there can be obtained metal plated products having a high peel strength of the metal plated layer and having at the same time a surface smoothness markedly excellent compared to the surface smoothness of plated products by conventional processes. The resulting metal plated products can sufficiently be applied to minute circuit patterns. They can also be used in resist pattern formation as well as in fabrication of printed circuit boards or three dimensional molded printed circuit boards.

The invention has been described in detail with respect to embodiments, and it will now be apparent from the foregoing to those skilled in the art that changes and modifications may be made without departing from the invention in its broader aspects, and it is the invention, therefore, in the appended claims to cover all such changes and modifications as fall within the true spirit of the invention.

What is claimed is:

1. A process of pretreating a metal plated resin molded article prior to metal plating it, said resin molded article being molded from a resin composition containing as main components a polyphenylene sulfide resin, a glass-reinforcing agent and optionally one or more other thermoplastic resins, which pretreatment comprises:

(1) treating said resin molded article by immersion in nitric acid or a mixed liquid of hydrogen peroxide and sulfuric acid (A treatment), (2) treating the resulting resin molded article by immersion in an organic polar solvent-containing liquid (B treatment), and then (3) (as a C treatment), treating the resulting resin molded article by immersion in sulfuric acid alone (C-1 treatment) and then immersion in an aqueous alkali solution alone (C-2 treatment).

2. The process as claimed in claim 1, wherein said polyphenylene sulfide resin contains a paraphenylene sulfide unit

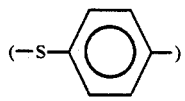

in an amount of at least 70 mole % of all recurring units.

3. The process as claimed in claim 1, wherein said resin composition has a composition in which (a) total amount of said polyphenylene sulfide resin and said glass-reinforcing agent is at least 60 % by weight, of said resin composition, and (b) ratio of said polyphenylene sulfide resin to said glass-reinforcing agent is in the range of 2:8 to 9:1 by weight.

4. The process as claimed in claim 1, wherein said other thermoplastic resin is at least one resin selected from the group consisting of polyester, polyarylate, polyamide, polyetherimide, polyethersulfone and polycarbonate.

5. The process as claimed in claim 1, wherein said resin composition contains said other thermoplastic resin in an amount of 5 to 20 % by weight.

6. The process as claimed in claim 1, wherein said acid solution used in said A treatment is a mixed liquid of hydrogen peroxide and sulfuric acid.

7. The process as claimed in claim 1, wherein said organic polar solvent-containing liquid used in said B treatment contains N-methylpyrrolidone or dimethylacetamide in an amount of at least 5 % by weight.

* * * * *